(12) United States Patent
Mauder et al.

(10) Patent No.: US 8,835,978 B2
(45) Date of Patent: Sep. 16, 2014

(54) LATERAL TRANSISTOR ON POLYMER

(75) Inventors: Anton Mauder, Kolbermoor (DE); Eric Graetz, Krumpendorf (AT)

(73) Assignee: Infineon Technologies AG, Neubiberg (DE)

( * ) Notice: Subject to any disclaimer, the term of this patent is extended or adjusted under 35 U.S.C. 154(b) by 135 days.

(21) Appl. No.: 13/471,453

(22) Filed: May 14, 2012

(65) Prior Publication Data

US 2013/0299871 A1 Nov. 14, 2013

(51) Int. Cl.
*H01L 29/66* (2006.01)
(52) U.S. Cl.
USPC ........................................ 257/140; 257/141
(58) Field of Classification Search
CPC ............ H01L 29/0696; H01L 29/1095; H01L 29/66325; H01L 29/7393
USPC ................. 438/133, 135, 286; 257/140, 141, 257/E29.027, E29.066, E29.197, E21.382
See application file for complete search history.

(56) References Cited

U.S. PATENT DOCUMENTS

| | | | |
|---|---|---|---|
| 2009/0057712 A1* | 3/2009 | Terashima | 257/141 |
| 2009/0194785 A1* | 8/2009 | Lu et al. | 257/139 |
| 2010/0084684 A1* | 4/2010 | Ito | 257/139 |

* cited by examiner

*Primary Examiner* — Brook Kebede
(74) *Attorney, Agent, or Firm* — SpryIP, LLC

(57) ABSTRACT

Representative implementations of devices and techniques provide a high-voltage device on a semiconductor substrate. An insulating polymer layer is formed on an opposite surface to the high-voltage device, the insulating polymer layer having a thickness of at least twice that of the semiconductor substrate.

25 Claims, 4 Drawing Sheets

LATERAL TRANSISTOR ON POLYMER

BACKGROUND

A transistor, such as a high-voltage or power transistor, may be laterally arranged (as opposed to vertically arranged) when used with smaller currents. The lateral arrangement may be convenient for low profile designs or for the integration of multiple transistor devices on a substrate.

During normal operation of a transistor, electric fields are generated with current flow in the upper layer(s) of the device. Additional electric fields are also generated in the underlying substrate of the transistor as well. In many lateral transistor designs, these electric fields influence each other, often creating performance issues.

One solution to the interaction of the electric fields includes forming the transistor components on a lightly doped substrate and coupling the lateral electric field to the top layer. With this solution, relatively long lateral components may be used to offset the potential reduction in the substrate. Additionally, wider edge structures may also be used with these high-voltage devices. The use of the longer and/or wider components may result in performance and/or design issues.

Another solution to the interaction of the electric fields includes selectively removing substrate from under some lateral transistor components. The resulting air insulator may reduce or remove interfering electric fields. However, the air insulator may be relatively deep to achieve a desired blocking voltage for the device. Structural strength of the device may be compromised due to the air gaps within the device, particularly if transistor components are formed on a membrane that is cantilevered over a relatively long air gap span. Further, the air gaps may be susceptible to penetration of solder, adhesives, or other materials during manufacturing. This may lead to an undesirable change in the blocking voltage of the device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide a high-voltage device on a surface of a semiconductor substrate. An insulating polymer layer is formed on an opposite surface of the substrate to the high-voltage device. In an implementation, the insulating polymer layer has a thickness of at least twice that of the semiconductor substrate. In another implementation, the insulating polymer layer has a thickness of at least 10 times that of the semiconductor substrate.

In one implementation, the substrate is "thinned" prior to the formation of the insulating polymer layer on the opposite surface of the substrate. In other words, a thickness of the substrate is reduced from a first thickness to a second, lesser thickness. Thinning the substrate may include grinding, mechanical or chemical-mechanical polishing, wet or dry chemical etching, combinations of the same, and the like. In alternate implementations, other processes may be used to reduce the thickness of the substrate.

The insulating polymer layer below the substrate provides structural benefits, while having only minor or no effect on the electric characteristics of the semiconductor device. For example, the thin substrate is supported on a relatively thick, stable, insulating polymer cushion. In addition, the insulating polymer layer may cause only minor changes to the electric field without deteriorating the blocking capability of the high voltage semiconductor device. For instance, the electric field built-up in the upper "working" layer(s) of the high voltage semiconductor device may penetrate the underlying polymer layer.

Various implementations and arrangements for a lateral transistor or a laterally arranged semiconductor device are discussed in this disclosure. Techniques and devices are discussed with reference to example insulated gate bipolar transistor (IGBT) devices illustrated in the figures. However, this is not intended to be limiting, and is for ease of discussion and illustrative convenience. The techniques and devices discussed may be applied to any of various transistor device designs, structures, and the like (e.g., junction field-effect transistor (JFET), metal-oxide-semiconductor field-effect transistor (MOSFET), metal-insulator-semiconductor FET (MISFET), metal-semiconductor FET (MESFET), insulated-gate FET (IGFET), high-electron mobility transistor (HEMT) or (HFET), modulation-doped FET (MODFET), etc.), or other semiconductor devices (e.g., diodes, thyristors, etc.) and remain within the scope of the disclosure.

Implementations are explained in more detail below using a plurality of examples. Although various implementations and examples are discussed here and below, further implementations and examples may be possible by combining the features and elements of individual implementations and examples.

Example Lateral Semiconductor Device

Figure 1:
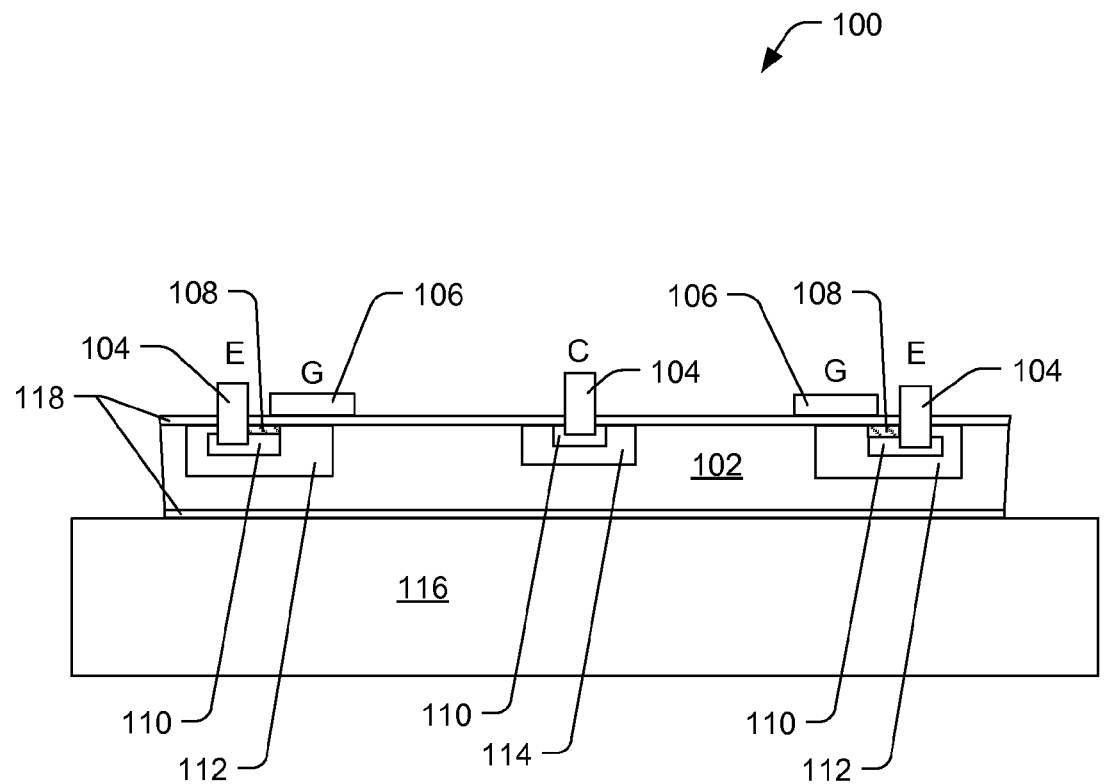
FIG. 1 is a profile view of an example semiconductor device formed on an integrated circuit, according to an implementation.

FIG. 1 is a profile view of an example integrated circuit (IC) 100, according to an implementation, wherein the techniques and devices described herein may be applied. As discussed above, the techniques, components, and devices described herein with respect to the IC 100 are not limited to the illustration in FIG. 1, and may be applied to other semiconductor devices and transistor structure designs without departing from the scope of the disclosure. In some cases, additional or alternative components may be used to implement the techniques described herein. It is to be understood that an IC 100 may be implemented as stand-alone device or as part of another system (e.g., integrated with other components, systems, etc.).

As shown in FIG. 1, an example IC 100 may include a semiconductor substrate 102, having two primary surfaces: a first surface (i.e., a top/upper/front surface, etc.) and a second surface (i.e., a bottom/lower/back surface, etc.). In one implementation, the substrate is comprised of silicon. In alternate implementations, the substrate is comprised of other semiconductor materials (e.g., germanium, gallium arsenide, gallium nitride, etc.). In an implementation, the substrate 102 is a thin-film semiconductor substrate 102. For example, the substrate 102 may be constructed to be a few micro-meters (microns) thick. In one implementation, the substrate 102 has a thickness of approximately 1 to 30 microns. In another implementation, the substrate 102 has a thickness of approximately 5 to 20 microns. In various implementations, the thickness of the substrate 102 may be related to the manufacturing processes involved. In other implementations, the thickness of the substrate 102 is reduced to a desired thickness, as is discussed below.

In an implementation, as shown in FIG. 1, one or more semiconductor devices are formed on a first surface of the substrate 102. Example semiconductor devices may include one or more components or groups of components formed on a surface of the substrate 102 and arranged to perform a function (e.g., transistors, diodes, thyristors, etc.). The one or more semiconductor devices may be formed in a lateral arrangement, for example. In an implementation, a laterally arranged semiconductor device may have components distributed along the first surface of the substrate 102. In alternate implementations, the one or more semiconductor devices may be formed in other arrangements (e.g., vertically, combinations of vertical and lateral arrangements, etc.).

In one example, the semiconductor device components are formed on the first surface of the substrate 102 while the thin-film substrate 102 is supported on a carrier, and held in place to mechanically stabilize the thin-film substrate 102. For example, the carrier may be a glass or silicon carrier disc with an adhesive layer or electrostatic properties to hold the thin-film substrate 102 in place.

As shown in FIG. 1, a semiconductor device may include components such as emitter/collector contacts 104 (also source/drain, etc.) and gate contacts 106 (also base, etc.). The semiconductor device may also include components imbedded into the substrate 102. For example, the semiconductor device may include source regions 108, highly doped terminal regions 110, doped body regions 112, buffer regions 114, and the like. In alternate implementations, a semiconductor device may include fewer, additional, or alternate components. In other implementations, such components formed on a surface of the substrate 102 or imbedded into the substrate 102 may be combined in various combinations, resulting in one or more semiconductor devices (e.g., transistors, diodes, thyristors, etc.). In one implementation, as shown in FIG. 1, the semiconductor device comprises a laterally arranged insulated gate bipolar transistor (IGBT), or the like.

In one implementation, the lateral high-voltage semiconductor device components are formed on the first surface of the semiconductor substrate 102 while the substrate 102 has a first thickness. This promotes stability of the formation process, for example. The corresponding processes are performed for the formation of the body, emitter and collector regions and for the formation of the controlling gates. Similarly, the dielectric layers, conductor structures, metallization, and passivation of the substrate 102 front side may be provided.

Figure 2:
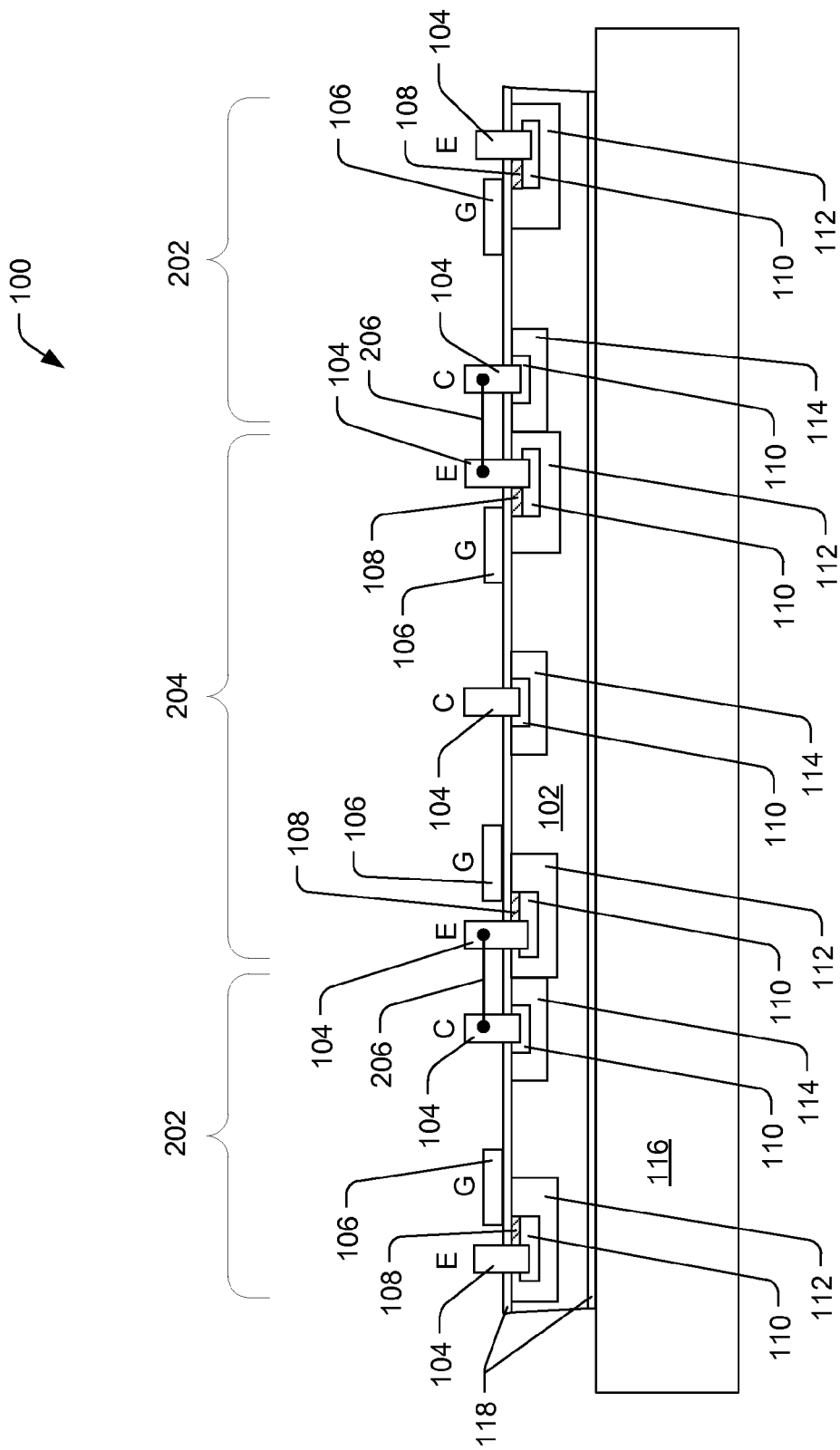
FIG. 2 is profile view of an example integrated circuit, including multiple semiconductor devices, according to an implementation.

Referring to FIGS. 1 and 2, in various implementations, doping of each of the terminal regions 110 may be performed by the same process, or by different processes. For example, in one implementation, the same process may be used to form each of the terminal regions 110, based on process cost and other convenience issues. However, in other implementations, a different doping process (e.g., dose, ion implantation energy, etc.) may be used for some of the terminal regions 110 for better performance, for example. In other words, some of the terminal regions 110 of an IC 100 may have different doping characteristics than other terminal regions 110, based on design, performance, manufacturing processes, and the like. In one example, as shown in FIG. 2, coupled collector-emitter pair terminal regions 110 may have a different doping profile than a single emitter terminal region 110. Further, this may also be the case with ICs 100 having multiple types of semiconductor devices formed on the surface of the substrate 102 (such as the diode formed in combination with the transistor illustrated in FIG. 3).

In various implementations, as mentioned above, the substrate 102 is "thinned" to reduce its thickness after the formation of the semiconductor device components. Thinning the substrate 102 may include grinding, mechanical or chemical-mechanical polishing, wet or dry chemical etching, combinations of the same, and the like. In alternate implementations, other processes may be used to reduce the thickness of the substrate.

In one implementation, after the substrate 102 is thinned, an insulating polymer layer 116 is formed on the second surface of the substrate 102. In other words, a thickness of the substrate 102 is reduced from the first thickness to a second, lesser thickness prior to formation of the insulating polymer layer 116. In one implementation, the thickness of the substrate 102 is reduced from the first thickness to an approximate thickness of between 1 and 30 microns or of between 5 and 20 microns prior to formation of the insulating silicone layer 116.

In one implementation, the polymer layer 116 has a thickness that is at least twice as thick as the thickness of the thin-film semiconductor substrate 102. In another implementation, the thickness of the insulating polymer layer 116 is approximately 30 times the thickness of the substrate 102. For example, in various implementations, the polymer layer 116 may have an approximate thickness of between 50 and 150 microns.

In one implementation, as illustrated in FIG. 1, the insulating polymer layer 116 has a larger footprint than the footprint of the substrate 102. For example, the boundaries of the polymer layer 116 may extend beyond the boundaries of the substrate 102 in one or more directions. In one example, the polymer layer 116 comprises an insulating silicone layer. In alternate implementations, the polymer layer 116 comprises one or more other polymer insulating materials.

In general, a polymer may conduct heat with less efficiency than other materials, such as metals and semiconductors, for example. Since semiconductor devices generate heat during operation and the proper operation of the semiconductor devices depends on dissipation of the heat, filler materials may be added to the polymer layer 116 to improve heat conduction. In one implementation, the insulating polymer layer 116 includes an inorganic filler arranged to increase a thermal conductivity of the insulating polymer layer 116. In various implementations, the inorganic filler may include aluminum nitride (AlN), aluminum oxide (Al2O3), silicon nitride (Si3N4), or the like. In one implementation, the inorganic filler may be in the form of a fine powder, and added to the polymer layer 116 to be dispensed onto the second surface of the substrate 102.

In one implementation, as shown in FIG. 1, an insulating passivation layer 118 may be formed on at least one of the first and second surfaces of the substrate 102. For example, a passivation layer 118 may be formed on the second surface of the substrate 102 prior to forming the insulating polymer layer 116. In one implementation, the passivation layer 118 is formed on the second surface of the substrate 102 after the substrate 102 has been thinned to reduce a thickness of the substrate 102. In one implementation, the passivation layer 118 is comprised of an oxide layer, such as a silicon oxide, for example. In another implementation, the passivation layer 118 is comprised of a nitride layer, such as a silicon nitride, or of a combination of oxides and nitrides, for example.

In various implementations, additional or alternative components may be used to accomplish the disclosed techniques and arrangements.

Example Implementations

FIG. 2 is profile view of an example integrated circuit 100, including multiple semiconductor devices, according to another implementation. As discussed above, multiple semiconductor devices may be formed on an IC 100, as well as multiple arrangements of the multiple semiconductor devices. In various implementations, this may be accomplished with lateral arrangements of semiconductor devices formed on the surface of the substrate 102.

The discussed techniques are advantageous when multiple transistors are arranged into a half-bridge on the substrate 102, for example. FIG. 2 shows two series-connected transistors (IGBTs) in a half-bridge arrangement. In another embodiment, the transistors are coupled in a parallel. Furthermore, the embodiments described herein are not limited to number of shown circuit elements. That is, more than two, or less, transistors may be used. A first transistor 202 represents the low-side transistor of the half-bridge and a second transistor 204 represents the high-side transistor of the half-bridge. In the example arrangement, a portion of the low-side transistor 202 is coupled on one side of the high-side transistor 204 via a coupling 206. Another portion of the low-side transistor 202 is coupled on the other side of the high-side transistor 204 via another coupling 206. The center-tap C of the low-side transistor and the center-tap E of the high-side transistor, as well as the gate wiring is not shown in FIG. 2 for clarity.

The lateral arrangement of the half-bridge means that the length of the IC 100 spans at least as long as two transistors. With the substrate 102 supported by the polymer layer 116, the IC 100 is mechanically stable, where such stability may be lacking in other designs without the polymer layer 116.

Figure 3:
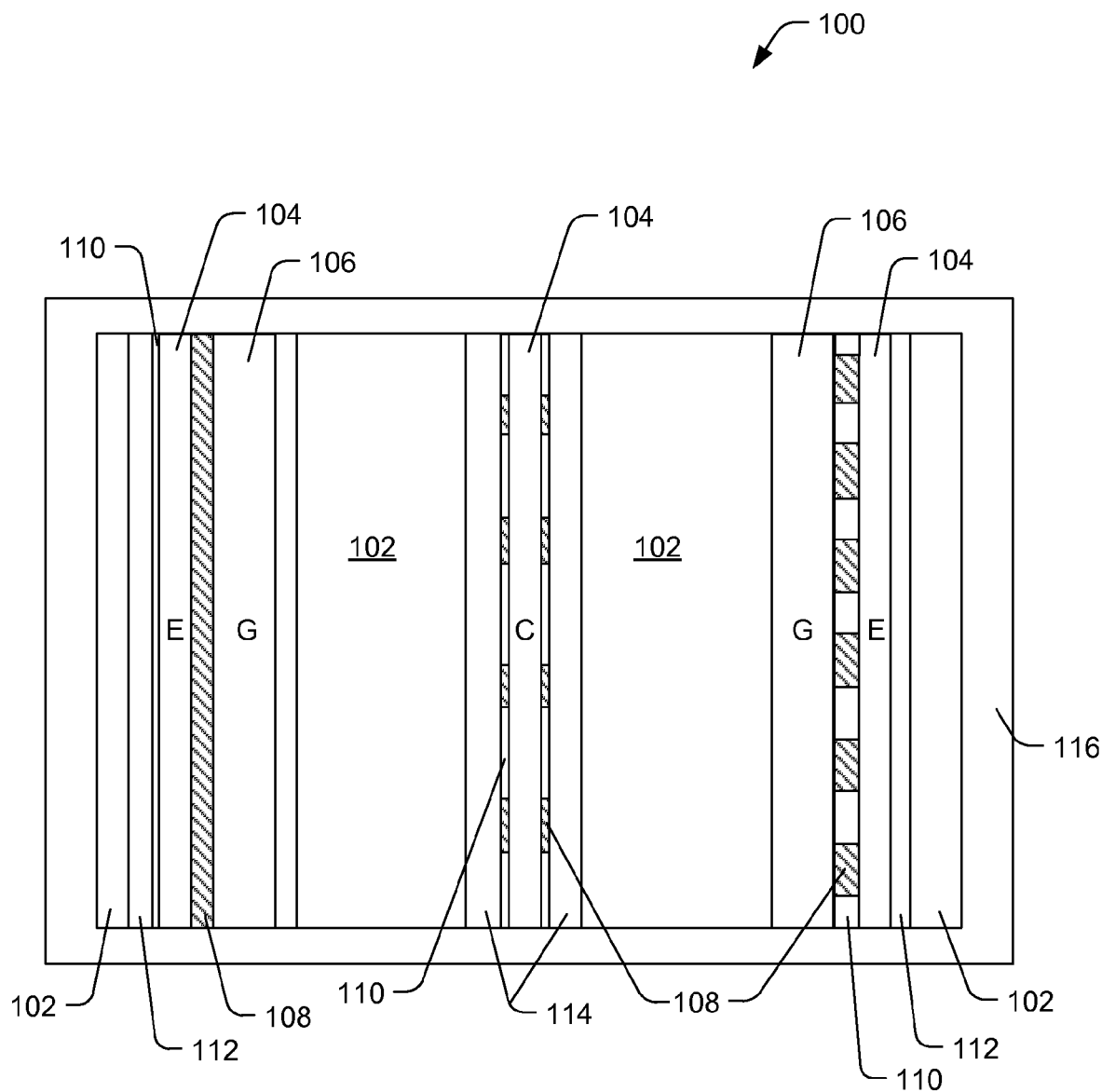
FIG. 3 is a plan view of an example integrated circuit, according to an implementation.

The discussed techniques are also advantageous when one or more transistors are arranged with one or more diodes on the substrate 102, for example. FIG. 3 shows a plan view of an IC 100, having an integration of diodes with a transistor on the substrate 102. The components at the left portion of FIG. 3 show an inverse diode coupled anti-parallel to the transistor. The components at the right portion of FIG. 3 show a partial shut-down of the transistor channel. In another embodiment, the diodes are coupled in a parallel. Furthermore, the embodiments described herein are not limited to number of shown circuit elements. That is, any number of diodes may be used.

In various implementations, as shown in FIG. 3, a reverse conducting diode with blocking capability may be used with half-bridges, for example, and also with some individual transistors. Integration of the diode with the transistor (an IGBT, for example) may be accomplished by replacing parts of the p-collector 104 by an n-type doping (as shown in the center of FIG. 3, beneath the collector 104). In an implementation, the performance of the diode and/or the transistor may be adjusted based on the lengths of the p and n regions. For example, a ladder structure having alternating p and n regions, as also shown in the right portion of FIG. 3, may be used to adjust the slope and the short-circuit protection of the circuit. The ladder structure may limit the width of the transistor channel, for example.

Representative Process

Figure 4:
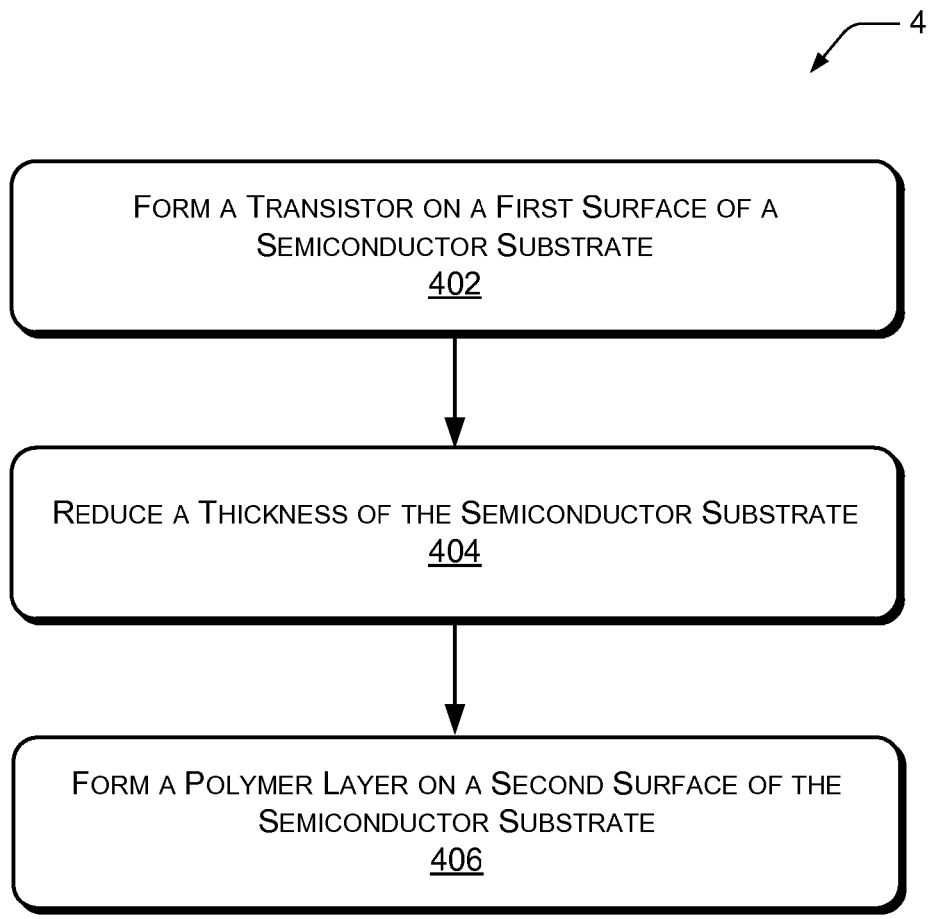
FIG. 4 is a flow diagram illustrating an example process for forming an example semiconductor device or example integrated circuit, according to an implementation.

FIG. 4 illustrates a representative process 400 for forming an integrated circuit (IC) (such as IC 100). The process 400 describes formation of one or more semiconductor devices (such as transistors, diodes, thyristors, etc.) on a substrate (such as substrate 102). A polymer layer (such as polymer layer 116) is formed on an opposite surface of the substrate. The process 400 is described with reference to FIGS. 1-3.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 402, the process includes forming a semiconductor device, such as a transistor or a diode, on a first surface of a semiconductor substrate. In one implementation, the process includes forming one or more other transistors, one or more other diodes, or the like, on the first surface of the semiconductor substrate. In an example, one or more of the other transistors and/or the other diodes are serially coupled to the semiconductor device.

At block 404, the process includes reducing a thickness of the semiconductor substrate from a first thickness to a second, lesser thickness. In one example, the semiconductor substrate is reduced to an approximate thickness of between 1 and 30 microns. In one implementation, the process includes reducing a thickness of the semiconductor substrate by grinding the semiconductor substrate in combination with mechanical or chemical-mechanical polishing and/or in combination with wet or dry chemical etching.

In an implementation, the process includes reducing the thickness of the substrate at the second surface after the semiconductor device has been formed on the first surface of the substrate. In one example, an etch stop is formed on the second surface of the semiconductor substrate. The etch stop is arranged to define a desired reduced thickness of the semiconductor substrate. In various implementations, the etch stop comprises a reverse-biased pn junction, a p+ doping region, or the like.

In the implementation, the process includes rough grinding the semiconductor substrate to reduce the thickness of the substrate to a lesser thickness, and then chemically etching the semiconductor substrate to the etch stop, and thus the desired thickness. The etch stop may then be removed with at least one of a chemical and/or a mechanical process.

In alternate implementations, various other thinning techniques may be used to reduce the thickness of the substrate.

At block 406, the process includes forming a polymer layer on a second surface of the semiconductor substrate. For example, the polymer layer may be formed by a spin-distribution, resulting in a homogeneous polymer layer. In one implementation, the polymer layer may comprise a silicone layer. In one example, the polymer comprises a photo-imageable silicone layer.

In an implementation, an inorganic filler may be added to the polymer of the polymer layer to increase the thermal conductivity of the polymer layer. In various implementations, the inorganic filler may include aluminum nitride (AlN), aluminum oxide (Al2O3), silicon nitride (Si3N4), or the like. In one implementation, the resistance to heat transfer of the polymer layer plus inorganic filler is much less than the resistance to heat transfer of the IC packaging. In one alternate implementation, a heat sink is added to the IC to increase heat transfer.

In various implementations, the thickness of the polymer layer is based on a desired reverse voltage characteristic for the transistor. For example, the thickness of the polymer layer may be increased to increase the reverse breakdown voltage of the semiconductor device. In one implementation, the polymer layer has a thickness that is at least twice as thick as the second, reduced thickness of the substrate. In one example, the polymer layer has an approximate thickness of between 50 and 150 microns.

In one implementation, the process includes removing excess polymer from the first surface of the semiconductor substrate by exposing the excess polymer to a light source and developing the excess polymer. In another implementation, the process includes annealing the polymer layer. The annealing may be useful to remove solvent and/or to firmly attach the polymer to the substrate. The annealing may also be useful to change the firmness or hardness of the polymer layer.

In an implementation, the process includes forming a passivation layer on the second surface of the semiconductor substrate prior to forming the polymer layer. For example, the passivation layer may comprise a silicon oxide (SiO2), a silicon nitride (Si3N4), a silicon oxynitride ($SiO_xN_y$), or the like. In one example implementation, the passivation layer is formed using a plasma-enhanced chemical vapor deposition (PECVD) process.

In other implementations, the IC may be separated into individual chips having one or more semiconductor devices each. For example, the IC may be separated by etching, such as isotropic etching (e.g., wet or dry chemical etching) from the underside of the IC. In one implementation, the IC is scored on the top side of the IC, and the separation is completed from the underside of the IC via etching.

In alternate implementations, other techniques may be included in the process 400 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A device, comprising:
a thin-film semiconductor substrate;
a transistor formed on a first surface of the thin-film semiconductor substrate; and
an insulating polymer layer formed on a second surface of the thin-film semiconductor substrate, the insulating polymer layer having a thickness that is at least twice as thick as a thickness of the thin-film semiconductor substrate.

2. The device of claim 1, wherein the transistor is a laterally arranged insulated gate bipolar transistor (IGBT).

3. The device of claim 1, wherein the insulating polymer layer has a larger footprint than a footprint of the thin-film semiconductor substrate.

4. The device of claim 1, wherein the insulating polymer includes an inorganic filler arranged to increase a thermal conductivity of the insulating polymer.

5. An integrated circuit, comprising:
a laterally arranged high-voltage semiconductor device formed on a first surface of a silicon substrate; and
an insulating silicone layer formed on a second surface of the silicon substrate, a thickness of the silicon substrate being reduced prior to formation of the insulating silicone layer, the insulating silicone layer having a thickness that is at least twice as thick as the thickness of the silicon substrate.

6. The integrated circuit of claim 5, further comprising another laterally arranged high-voltage semiconductor device formed on the first surface of the silicon substrate, forming a half-bridge arrangement with the laterally arranged high-voltage semiconductor device.

7. The integrated circuit of claim 5, wherein the thickness of the silicon substrate is reduced to an approximate thickness of between 1 and 30 microns prior to formation of the insulating silicone layer.

8. The integrated circuit of claim 5, wherein the thickness of the insulating silicone layer is approximately 10 times the thickness of the silicon substrate.

9. A method, comprising:
forming a transistor on a first surface of a semiconductor substrate;
reducing a thickness of the semiconductor substrate from a first thickness to a second lesser thickness; and
forming a polymer layer on a second surface of the semiconductor substrate, the polymer layer having a thickness that is at least twice as thick as the second thickness.

10. The method of claim 9, further comprising forming at least one of another transistor and a diode on the first surface of the semiconductor substrate.

11. The method of claim 10, wherein at least one of the other transistor and the diode are serially coupled to the transistor.

12. The method of claim 9, further comprising reducing a thickness of the semiconductor substrate by grinding the semiconductor substrate in combination with a wet chemical etching.

13. The method of claim 9, further comprising:
forming an etch stop on the second surface of the semiconductor substrate, the etch stop arranged to define a desired reduced thickness of the semiconductor substrate;
grinding the semiconductor substrate to reduce the thickness of the semiconductor substrate;
chemically etching the semiconductor substrate to further reduce the thickness of the semiconductor substrate to the etch stop; and
removing the etch stop with at least one of a chemical and a mechanical process.

14. The method of claim 13, wherein the etch stop comprises at least one of a reverse-biased pn junction and a p+ doping.

15. The method of claim 9, further comprising forming a passivation layer on the second surface of the semiconductor substrate prior to forming the polymer layer.

16. The method of claim 15, wherein the passivation layer comprises one of a silicon oxide or a silicon nitride.

17. The method of claim 15, wherein the passivation layer is formed using a plasma-enhanced chemical vapor deposition (PECVD) process.

18. The method of claim 9, further comprising removing an excess polymer from the first surface of the semiconductor substrate by exposing the excess polymer to a light source and developing the excess polymer.

19. The method of claim 9, further comprising annealing the polymer layer.

20. The method of claim 9, wherein the semiconductor substrate is reduced to an approximate thickness of between 1 and 30 microns.

21. The method of claim 9, wherein the polymer layer comprises a photo imageable silicone layer.

22. The method of claim 9, wherein the polymer layer has an approximate thickness of between 50 and 150 microns.

23. The method of claim 9, wherein a thickness of the polymer layer is based on a desired reverse voltage characteristic for the transistor.

24. An integrated circuit, comprising:
   at least two serially connected high-voltage semiconductor devices formed on a first surface of a silicon substrate; and
   an insulating silicone layer formed on a second surface of the silicon substrate, a thickness of the silicon substrate being reduced prior to formation of the insulating silicone layer, the insulating silicone layer having a thickness that is at least twice as thick as the thickness of the silicon substrate.

25. The integrated circuit of claim 24, wherein at least one of the serially connected high-voltage semiconductor devices is an insulated gate bipolar transistor (IGBT) and at least another of the serially connected high-voltage semiconductor devices is a diode.

* * * * *